United States Patent [19]

Okazaki

[11] Patent Number: 4,686,001
[45] Date of Patent: Aug. 11, 1987

[54] METHOD FOR FORMING CONTACT LAYER ON SEMICONDUCTOR LIGHT EMITTING DEVICE

[75] Inventor: Niro Okazaki, Isehara, Japan

[73] Assignee: Fujitsu Limited, Kanagawa, Japan

[21] Appl. No.: 812,656

[22] Filed: Dec. 23, 1985

[30] Foreign Application Priority Data

Dec. 26, 1984 [JP] Japan ............... 59-277539

[51] Int. Cl.$^4$ ............... H01L 21/208; H01L 21/306; H01L 33/00
[52] U.S. Cl. ............... 156/652; 156/655; 156/662; 156/664; 134/5; 134/42; 252/79.3; 437/225
[58] Field of Search ............... 156/651, 652, 655, 656, 156/662, 664; 252/79.3; 134/5, 42; 29/569 L

[56] References Cited

U.S. PATENT DOCUMENTS 4,428,795 1/1984 Köhl et al. ............... 252/79.3

FOREIGN PATENT DOCUMENTS 51-16286 2/1976 Japan ............... 252/79.3
55-55522 4/1980 Japan .

*Primary Examiner*—S. Leon Bashore
*Assistant Examiner*—Andrew J. Anderson
*Attorney, Agent, or Firm*—Armstrong, Nikaido, Marmelstein & Kubovcik

[57] ABSTRACT

A method for producing a semiconductor light emitting device wherein a contact layer of InGaAsP is formed on a semiconductor layer, including forming the InGaAsP contact layer on the semiconductor layer; subsequently, forming an InP cover layer on the contact layer; cleaning the surface of the InP cover layer by a solution which selectively melts indium; and removing the InP cover layer by a selective etching process.

3 Claims, 7 Drawing Figures

METHOD FOR FORMING CONTACT LAYER ON SEMICONDUCTOR LIGHT EMITTING DEVICE

BACKGROUND OF THE INVENTION

1. Field of the Invention

The present invention relates to a method for producing a light emitting device, more particularly to a method for forming a contact layer of indium gallium arsenic-phosphorus (InGaAsP) in a light emitting device.

2. Description of the Related Art

A light emitting device such as a semiconductor laser diode (LD) or light emitting diode (LED) has come into increasing use as a light source in optical communication or data processing systems. When so used, the light emitting device is required to have a long life.

A light emitting device usually uses a contact layer of InGaAsP into which impurities can be incorporated or dopants (such as Zn, and Cd) at a high concentration, for example, an order of $10^{19}/cm^3$. When the concentration of the impurities is reduced, the contact resistance (Rs) between the contact layer and an electrode formed on the contact layer is increased. Therefore, the above-mentioned high concentration of impurities or dopants is required for a low contact resistance. Such impurities are easily highly incorporated into InGaAsP, but not into InP.

However, when a InGaAsP contact layer is formed on semiconductor layers, very small particles of indium are often left on the surface of the InGaAsP contact layer. The reason for this is that after the formation of an uppermost InGaAsP contact layer by the liquid phase epitaxial growth, some melt is left on the contact layer, which is an indium rich melt (90%~), especially, due to the wave state of the surface of the InGaAsP contact layer, some particles of indium, which is present in large amounts in InGaAsP, are left. The small indium particles detract from the formation of electrodes on the InGaAsP contact layer or lead to release of the electrodes, these reducing the lifetime of the semiconductor light emitting device.

Japanese Unexamined Patent Publication No. 55-55522 discloses a liquid phase epitaxial process wherein, after forming an upper semiconductor layer, an additional layer of InP or InGaAsP is formed thereon to remove indium left thereon, and, after cooling, the additional layer of InP or InGaAsP is etched by a well known etchant to expose the upper semiconductor layer. However, the process of the prior art does not sufficiently eliminate the indium particles on the upper semiconductor layer of InGaAsP.

SUMMARY OF THE INVENTION

It is an object of the present invention to eliminate the above mentioned problems.

It is a further object of the present invention to provide a method for producing a semiconductor light emitting device wherein indium particles on a contact layer are well removed.

According to the present invention, there is provided a method for producing a semiconductor light emitting device wherein a contact layer of InGaAsP is formed on a semiconductor layer, including the steps of; forming the contact layer on the semiconductor layer; forming an InP cover layer on the contact layer; cleaning the surface of the InP cover layer by a selective etching solution (etchant) which dissolves indium; and removing the InP cover layer by a selective etching process.

DESCRIPTION OF THE PREFERRED EMBODIMENTS

Before describing the preferred embodiments of the present invention, the prior art is further described.

Figure 1:
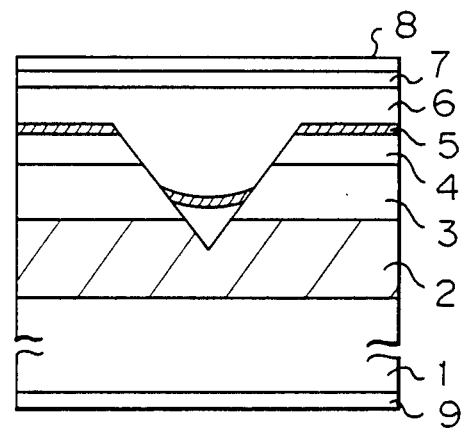
FIG. 1 is a cross-sectional view of a V-grooved substrate buried hetero structure of an LD.

FIG. 1 shows a V-grooved substrate buried hetero structure (VSB) of an LD.

As shown in FIG. 1, an n type indium phosphorus (InP) substrate 1 has formed on it an n type InP buffer layer 2, P type InP block layer 3, n type InP block layer 4. InGaAsP active layer 5, P type InP clad layer 6, and P type InGaAsP contact layer 7, in that order. Further, the upper surface of the contact layer 7 and the lower surface of the substrate 1 have respectively formed thereon metal electrodes 8 and 9 ohmically contacting thereto.

Thus, the uppermost semiconductor layer is usually a contact layer of InGaAsP into which the concentration of impurities can be increased as explained above. Since the concentration of impurities cannot be increased in InP, InP cannot be used as a contact layer.

The qualities of the respective semiconductor layers including the InGaAsP contact layer determine the lifetime of the semiconductor light emitting device.

Figure 2:
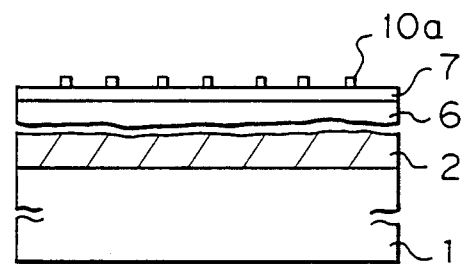
FIG. 2 is a cross-sectional view illustrating In particles left on a contact layer.

A conventional method for forming an InGaAsP contact layer will now be explained with reference to FIG. 2.

The semiconductor layers formed on the substrate 1 are made of compound semiconductors. The semiconductor layers of compound semiconductors are usually formed by a liquid phase epitaxial process.

Figure 3:
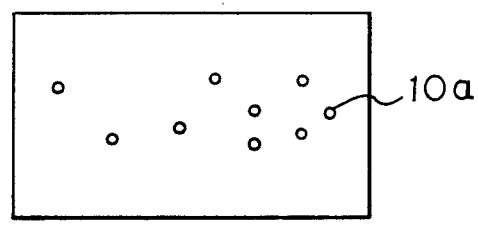
FIG. 3 is a schematic view of a microscopic picture (×50) illustrating In particles.

After forming a p type InP clad layer 6, an InGaAsP contact layer 7 is formed by the liquid phase epitaxial process as the uppermost layer of the semiconductor layer. On the surface of the thus formed InGaAsP contact layer 7, indium particles 10a are left as shown in FIGS. 2 and 3. If the indium particles are large, they are removed by using, for example, a cloth buff. However, it was found by the inventor that the very small indium particles 10a left on the InGaAsP contact layer 7 cannot be removed thereby. When an electrode 8 is formed on the InGaAsP contact layer 7 having the small indium particles 10a thereon, the lifetime of the semiconductor light emitting device is reduced due to the small indium particles positioned between the InGaAsP contact layer 7 and the electrode 8.

As mentioned above, Japanese Unexamined Patent Publication No. 55-55522 discloses a liquid phase epitaxial process in which, after forming an upper semiconductor layer of, for example, InGaAsP or InP, an additional layer of InP or InGaAsP different from the upper semiconductor layer is formed to melt indium left thereon and, after cooling, the additional layer of InP or InGaAsP is etched by well known different etchants without removing the indium particles.

However, in the prior art, indium newly left on the additional layer of InP is still left on the upper semiconductor layer even after etching the InP using a well known etchant, for example, HCl or HBr. Namely, although InP can be easily melted by the etchant indium cannot be easily melted thereby.

A preferred embodiment of the present invention will be explained below.

Figure 4A:
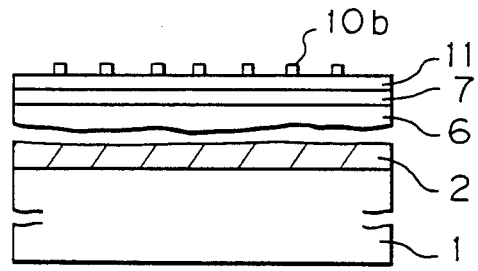
FIG. 4A to 4C are cross-sectional views of steps according to the present invention.
Figure 4B:
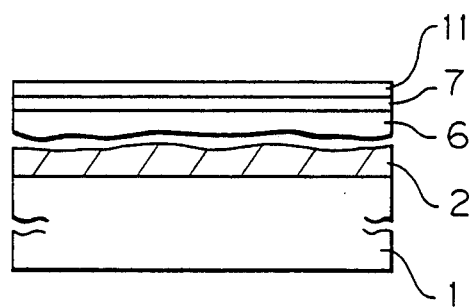
Figure 4C:
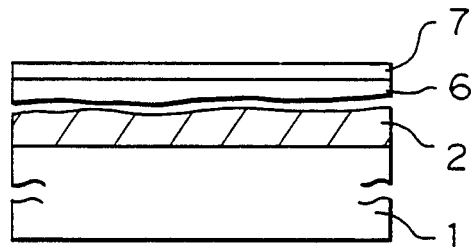

FIGS. 4A to 4C show cross-sectional views of steps according to the present invention. Layers 2, 3, 4, and 5 are conventionally formed on an InP substrate 1 and after a p type clad layer 6 (having a thickness of about 1 µm) is formed on the layer 5, a p type InGaAsP contact layer 7 (having a thickness of about 0.5 µm) is formed while indium particles are left thereon due to the wave state of the surface thereof. Subsequently an InP cover layer 11 (having a thickness of about 0.5 µm) is formed on the p type InGaAsP contact layer 7 by the liquid phase epitaxial process. During the formation of the InP cover layer 11, small particles left on the p type InGaAsP contact layer are melted into the InP melt for the InP cover layer 11 with the result that no indium particles are seen between the contact layer 7 and the cover layer 11 and new indium particles 10b are left on the cover layer 11 due to the wave state of the surface thereof.

Thus, as shown in FIG. 4B in order to remove the new indium particles 10b, the surface of the InP cover layer 11 is flushed or cleaned with a mixed solution of HF and HNO$_3$ (mixed ratio 1:1). By the mixed solution, InP cannot be easily melted but indium particles left on the surface of the InP cover layer 11 can be easily melted or dissolved so that indium particles 10b left on the cover layer 11 can be selectively removed without breaking the InP cover layer 11.

On the other hand, no solution by which only indium particles on the InGaAsP contact layer can be melted or removed has been found. Thus, the InP cover layer for which there is a suitable etchant is needed to remove indium particles.

Then, as shown in FIG. 4C, the InP cover layer 11 on the InGaAsP contact layer 7 can be selectively removed by an etching process using HCl or HBr as an etchant so that the previously formed contact layer 7 is exposed. The inventor found by using an optical microscope that no indium particles were seen on the InGaAsP contact layer 7.

As explained above, since a solution by which indium on InGaAsP can be selectively removed has not been found, a combination of InGaAsP-InP-In particles is used in the present invention. First, indium particles are selectively removed by a mixed solution of HF and HNO$_3$. Second, InP is selectively removed by HCl or HBr, with the result that indium particles left on the InGaAsP can be removed.

Figure 5:
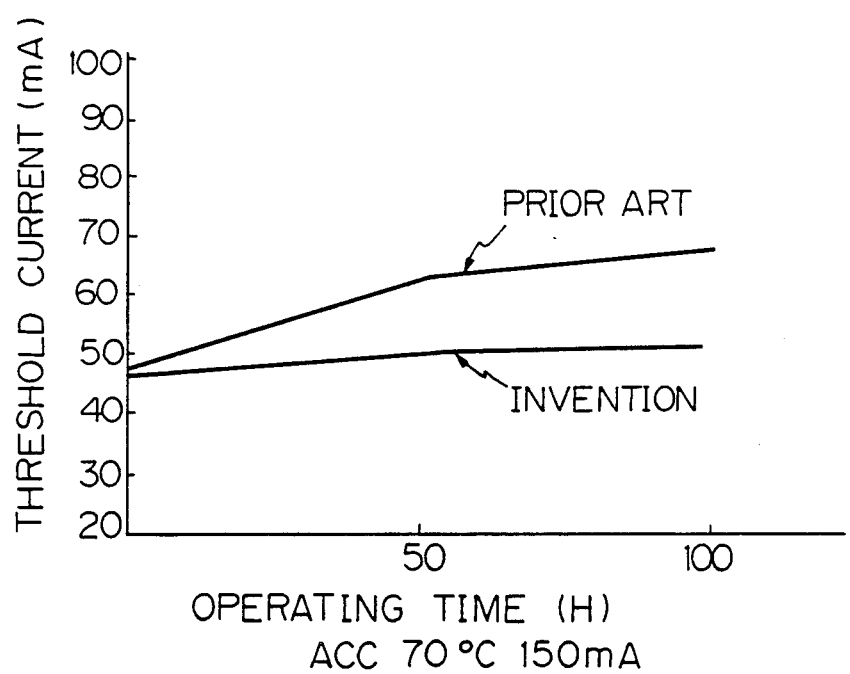
FIG. 5 is a graph of the lifetime of light emitting devices of the prior art and the present invention.

Thus, an improved LD according to the present invention is produced. FIG. 5 is a graph of the lifetime of light emitting devices of the prior art and the present invention.

When the indium particles are left on the InGaAsP contact layer, the lifetime of an LED, etc. is reduced. The reason therefor is not clear. However, it was found that the lifetime of an LED in which indium particles were removed by the present invention could be increased.

As shown in FIG. 5, when a device according to the present invention is operated for 100 hours at 70° C. under 150 mA, the threshold current is not increased that much compared to the device of the prior art. Therefore the lifetime is improved in the present invention.

I claim:

1. A method for producing a semiconductor light emitting device wherein a contact layer of indium gallium arsenic phosphorus (InGaAsP) is formed on a semiconductor layer, comprising the steps of:
    forming an InGaAsP contact layer on a semiconductor layer;
    subsequently, forming an InP cover layer on said InGaAsP contact layer;
    removing surface In from the InP cover layer by cleaning the surface of said InP cover layer with a solution which selectively melts indium but not InP; and
    removing said InP cover layer from said InGaAsP contact layer by a selective etching process using an etchant which dissolves InP but not InGaAsP.

2. A method for producing a semiconductor light emitting device according to claim 1, wherein said solution which selectively melts indium is a mixed solution of HF and HNO$_3$.

3. A method for producing a semiconductor light emitting device according to claim 1, wherein the etchant used in said selective etching process is HCl or HBr.

* * * * *